(12) United States Patent
Maleville et al.

(10) Patent No.: US 6,429,094 B1
(45) Date of Patent: *Aug. 6, 2002

(54) TREATMENT PROCESS FOR MOLECULAR BONDING AND UNBONDING OF TWO STRUCTURES

(75) Inventors: Christophe Maleville, Bernin; Bernard Aspar, Rives, both of (FR)

(73) Assignee: Commissariat A l'Energie Atomique, Paris (FR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 14 days.

(21) Appl. No.: 09/132,059

(22) Filed: Aug. 11, 1998

(30) Foreign Application Priority Data

Aug. 19, 1997 (FR) .............................. 97 10480

(51) Int. Cl.[7] .......................... H01L 21/30; H01L 21/46
(52) U.S. Cl. ............... 438/455; 438/458; 148/DIG. 12; 148/DIG. 135
(58) Field of Search ................................ 438/458, 455, 438/406, 407; 148/DIG. 12, DIG. 135

(56) References Cited

U.S. PATENT DOCUMENTS

| 5,310,451 A | * | 5/1994 | Tejwani et al. ............. 156/630 |
| 5,503,704 A | * | 4/1996 | Bower et al. ............... 156/281 |
| 5,510,277 A | * | 4/1996 | Cunningham et al. ......... 437/24 |
| 5,882,987 A | * | 3/1999 | Srikrishnan ................ 438/458 |
| 6,010,591 A | * | 1/2000 | Goesle ....................... 156/281 |

FOREIGN PATENT DOCUMENTS

| EP | 0 751 556 | 1/1997 |
| FR | 2 501 907 | 9/1982 |
| WO | WO 94/17551 | 8/1994 |

OTHER PUBLICATIONS

B. Aspar, et al., Basic Mechanisms involved in a Smart–Cut Process, 1997 Microelectronic Engineering 36 pp. 233–240.*

M. Bruel et al., Smart Cut: A promising New SOI material Technology, 1995, Proceedings 1995 IEE International SOi conference, Oct. 1995.*

W. P. Maszara, et al., Journal of Applied Physics, vol. 64, No. 10, pp. 4943–4950, "Bonding of Silicon Wafers For Silicon–On–Insulator", Nov. 15, 1988.

R. Stengl, et al., Japanese Journal of Applied Physics, vol. 28, No. 10, pp. 1735–1741, "A Model For The Silicon Wafer Bonding Process", Oct. 1989.

Michel Bruel, Nuclear Instruments and Methods in Physics Research B, vol. 108, pp. 313–319, "Application of Hydrogen Ion Beams to Silicon on Insulator Material Technology", 1996.

* cited by examiner

*Primary Examiner*—Olik Chaudhuri
*Assistant Examiner*—Shrinivas H. Rao
(74) *Attorney, Agent, or Firm*—Oblon, Spivak, McClelland, Maier & Neustadt, P.C.

(57) ABSTRACT

Process for providing separable structures comprising providing at least two structures wherein at least one structure contains a diffusable element contacting said structures under conditions providing molecular bonding of said structures along a bonding interface and heating said bonded structures under conditions causing diffusion of the diffusable element to the bonding interface where said diffusable element interacts with the bonding interface enabling the unbounding of said structures along the bonding interface. This process is useful in the manufacture of devices with integrated circuits.

13 Claims, 4 Drawing Sheets

TREATMENT PROCESS FOR MOLECULAR BONDING AND UNBONDING OF TWO STRUCTURES

TECHNICAL DOMAIN

This invention relates to a treatment process for bonding two structures by molecular adhesion, and unbending.

A structure is any micromechanical or integrated optical part, or microelectronic part that could be combined with another part by bonding. For example, this type of structure could be a substrate or a support board, equipped or not equipped with electronic, optical or mechanical components.

Furthermore, bonding by molecular adhesion refers to bonding that involves an interaction between chemical terminations present on the surfaces of structures in contact with each other.

The invention has applications particularly in the manufacture of devices with integrated circuits. In some manufacturing processes, semi-conductor boards containing integrated circuits must be combined with stiffening substrates, and then separated at the end of the treatment.

STATE OF PRIOR ART

As mentioned above, and particularly in microelectronic applications concerning the manufacture of power circuits, semi-conductor wafers comprising integrated electronic circuits are in the form of large thin boards. For example, wafers with a diameter of four inches ($\equiv$10 cm) and a thickness of less than 200 $\mu$m are used.

Standard equipment for the manufacture of microelectronic devices, for example such as photorepeaters, are not suitable for the treatment of boards this thin. Furthermore, thin semiconductor boards are fragile, and this is incompatible with handling steps, and particularly handling using automated treatment equipment.

A thin board or a surface layer of a substrate with or without integrated circuits may be bonded on a treatment support also called a "handling substrate". The handling substrate thus provides it with sufficient mechanical strength for all required treatments and manipulations.

The attached FIGS. 1 to 3 described below illustrate transfer of a thin layer comprising integrated circuits, as an example.

The thin layer, marked in FIG. 1 as reference 10, is initially fixed to a substrate 12, called the source substrate. It comprises integrated electronic components and circuits, which are not shown.

The source substrate 12 and the thin surface layer 10 are transferred to a handling substrate 14 by bonding the thin surface layer on the handling substrate. The structure thus obtained is shown in FIG. 1.

The source substrate is then eliminated by a process such as grinding or cleavage, by etching and/or polishing to obtain the structure shown in FIG. 2.

The thin layer 10 comprising integrated circuits is then bonded upside down on the handling substrate 14. The handling substrate thus provides this layer with the stiffness necessary for other manufacturing operations or treatments.

In a final step shown in FIG. 3, the thin layer 10 containing the electronic circuits is transferred to a target substrate or a destination substrate 16, onto which it is permanently fixed.

After attachment to the destination substrate 16, the thin layer 10 is separated from the handling substrate 14. Thus the handling substrate 14 is shown in dashed lines in FIG. 3.

This type of process is described in more detail in document (1), for which the reference is given at the end of this description.

The thin layer 10 may be bonded on the handling substrate 14, for example cold using an appropriate glue. Bonding is then reversible and it is possible to separate the thin layer 10 from the handling substrate. However, the adhesion obtained between the thin layer 10 and the handling substrate 14 may be insufficient, particularly for subsequent treatments at high temperature. In particular, the glue is incapable of resisting high temperatures.

Furthermore, the material (glue) added for bonding can cause metallic or organic contamination of bonded parts during subsequent treatments.

These disadvantages are avoided by preferring bonding by molecular adhesion which does not use any glue or added material. Bonding two structures by molecular adhesion includes four main steps, which are described below.

A first step is surface preparation of the structures to be brought into contact. A good quality molecular bonding requires control of important parameters such as surface roughness, which should preferably be less than 0.5 nm (4 Å) as a root mean square value, the lack of any dust (particles >0.2 $\mu$m) on surfaces, the planeness of the surfaces to be put in contact, and the chemical state of these surfaces.

Thus the first step consists mainly of cleaning the surfaces of structures to be bonded in order to eliminate foreign particles and to make these surfaces hydrophile.

FIG. 4 shows a structure for bonding comprising a silicon substrate 20, one surface 22 of which has been made hydrophile. Surface 22 comprises a first hydrophile layer 24 composed essentially of Si—OH chemical groups and one (or several) layers of water $H_2O$ 26 adsorbed on the hydrophile layer 24.

A second step consists of putting the hydrophile surfaces of the two structures to be bonded into contact. Putting them into contact brings the water layers adsorbed on these structures sufficiently close together for them to interact with each other. The attraction exerted between the water molecules is propagated gradually along the entire surface of each structure. The surfaces in contact are then bonded together.

The bonding energy as measured by a blade insertion method is of the order of 0.15 $J/m^2$. This value is typically the value of hydrogen type adhesion between two water layers, on each structure.

Document (2), the reference of which is given at the end of this description, contains an illustration of the blade insertion method.

A third step consists of solidification heat treatment of the adhesion.

The heat treatment can eliminate water layers between the assembled structures, up to a temperature of the order of 200° C.

Adhesion of structures then takes place by bonding of OH groups between the layers of Si—OH chemical groups in each structure, respectively. Note that the layer of Si—OH groups is shown as reference 24 in FIG. 4. This interaction results in a reduction of the distance between the two structures in contact and results in the interaction of additional OH groups. The bonding energy thus increases for treatment temperatures of 200° C. to 900° C.

Finally, there may be a fourth step consisting of heat treatment at more than 900° C. In this step, the interacting Si—OH groups change towards Si—O—Si type bonds, which are much stronger. This then gives a very strong increase in the bonding energy.

The graph in FIG. 5 shows the bonding energy per unit area between structures bonded by molecular adhesion as the ordinate, as a function of the treatment temperature. Bonding energies are expressed in J/m² and temperatures are expressed in °C.

Regions 32, 33 and 34 in the graph are related to the second, third and fourth steps in the bonding process and correspond to a hydrogen type interaction between water films, a hydrogen interaction between OH groups (reference 24), and then an Si—O—Si type interaction, respectively. A more detailed description of bonding of silicon wafers may be found in document (3), the reference of which is given at the end of this description.

Note that at treatment temperatures above 600° C., it becomes impossible to unbond the two assembled structures without causing severe degradation to them.

When the assembled structures are silicon boards, bonding energies greater than 2 J/m² may be obtained. These energies are thus of the same order of magnitude as the cohesion energies of the silicon material.

It is immediately clear that if molecular bonding is used in a transfer process like that shown in FIGS. 1 to 3, it will be impossible to detach the handling substrate from the thin layer by applying mechanical forces, without destroying the thin layer or the handling substrate.

Thus, the thin layer is separated from the handling substrate by eliminating the handling substrate. For example the handling substrate can be eliminated by grinding and/or mechanical-chemical abrasion.

In this case, the process for transferring a thin layer involves the sacrifice of a handling layer for each treated thin layer. This sacrifice also introduces a large industrial cost.

DESCRIPTION OF THE INVENTION

The purpose of this invention is to propose a treatment for bonding of two structures which can firstly give a very strong molecular bond between the two structures, and will also enable unbonding of the structures along the bonding interface.

Another purpose of the invention is to propose a treatment enabling unbending that does not damage the assembled structures.

More precisely in order to achieve these objectives, the purpose of the invention is a treatment process for bonding two structures by molecular adhesion on a bonding interface, and for separation of the two structures along the said bonding interface.

In accordance with the invention,
bonding is done using at least one structure containing at least one element capable of diffusing within the said structure to the bonding interface, and
a heat treatment is used for unbonding, with a sufficient heat budget to make the said element diffuse towards the bonding interface to weaken it.

An element capable of causing diffusion refers to any element or compound either intrinsically present in the material or added to it, deliberately or accidentally, capable of migrating within the material towards the bonding interface, to react with it. This element is then capable of modifying this interface during the heat treatment and will cause separation of the two parts on each side of the interface. This separation may be assisted by a gaseous phase which may form at the interface during the heat treatment.

Furthermore, heat budget means the sum of heat treatments carried out and defined by a time/temperature pair applied to the structure.

Thus, the heat treatment designed to separate the two parts (on each side of the bonding interface) may take account of heat treatments applied to the assembled structures before unbending.

According to one particular embodiment of the process, a hydrogen implantation may be done before bonding in at least one of the structures, the hydrogen forming the said element capable of diffusing in the structure.

For example, implantation is done in silicon with a dose of between $10^{16}$ and $5.10^{16}$ ($H^+/cm^2$) and an energy of between 20 and 500 keV. Preferably, the dose may be of the order of $3.10^{16}$ ions/cm and the implantation energy of the order of 70 keV. The dose depends on the implantation conditions and particularly the temperature of the structure during the implantation.

According to one variant, at least one structure may also be used comprising a surface oxide layer formed by plasma enhanced chemical vapor deposition and containing OH molecules, the said OH molecules forming the element capable of diffusing.

For example, the heat treatment for unbending may be done at a temperature of between 600 and 1350° C. for silicon. This temperature would be chosen to be of the order of 200 to 600° C. for gallium arsenide (AsGa). For silicon carbide ($S_iC$), the chosen temperature will be between 600° C. and the melting temperature which exceeds 1350° C.

For example, the heat treatment may take place under heating lamps or in a furnace.

The structures to be assembled may be structures made of a single solid material, or may be multi-layer structures containing zones which may or may not have been treated.

The multi-layer nature of the structures may beneficially generate internal stresses that facilitate separation of structures during the unbending step.

Similarly, the surface of at least one of the structures to be assembled may be prepared before bonding to form a relief. This relief may also facilitate separation of the structures when unbending.

Finally, external separation forces may be exerted on the structures to further facilitate unbending. For example, tension or bending forces, or shear forces, may be exerted on the structures by inserting a blade at the interface between the structures.

Other characteristics and advantages of the invention will become clearer from the following description with reference to the figures in the attached drawings. This description is given for illustration only, and is in no way restrictive.

DETAILED DESCRIPTION OF EMBODIMENTS OF THE INVENTION

Figure 1:
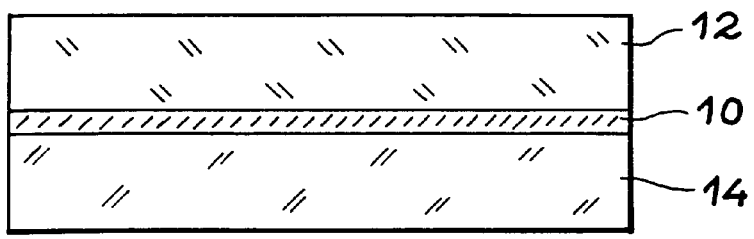
FIG. 1, already described, is a schematic section of a structure comprising a thin layer on a substrate called the source substrate, assembled with another substrate called the handling substrate.
Figure 2:
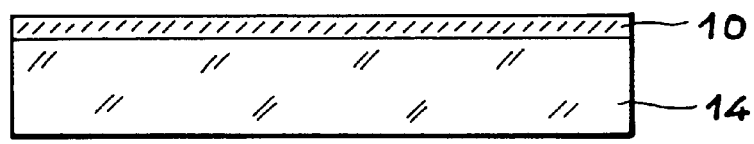
FIG. 2, already described, is a schematic section of the handling substrate on which the thin layer is bonded.
Figure 3:
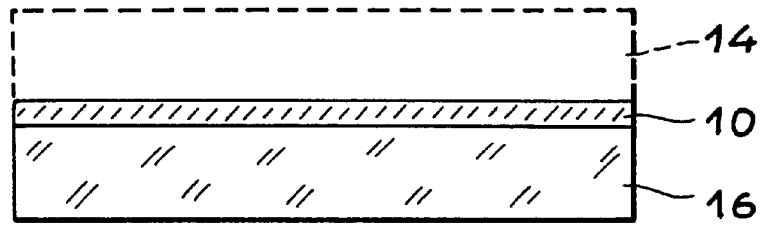
FIG. 3, already described, is a schematic section of the thin layer transferred onto a substrate called the destination substrate.
Figure 4:
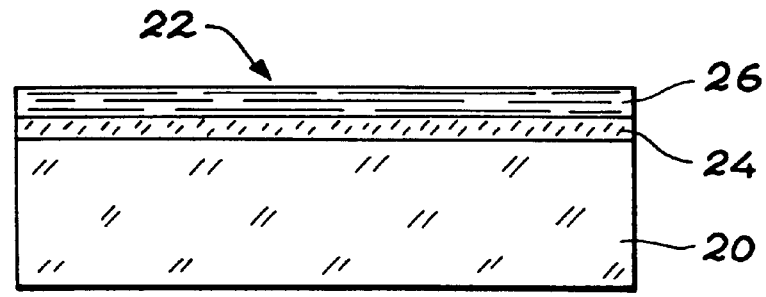
FIG. 4 is a schematic section of a structure prepared for molecular bonding.
Figure 5:
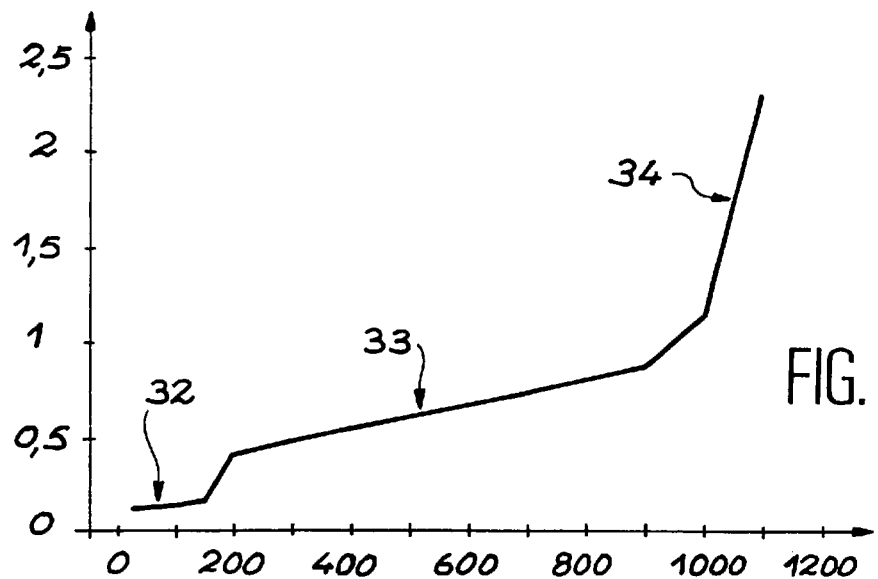
FIG. 5 is a graph showing the bonding energy between two structures during molecular bonding steps.
Figure 6:
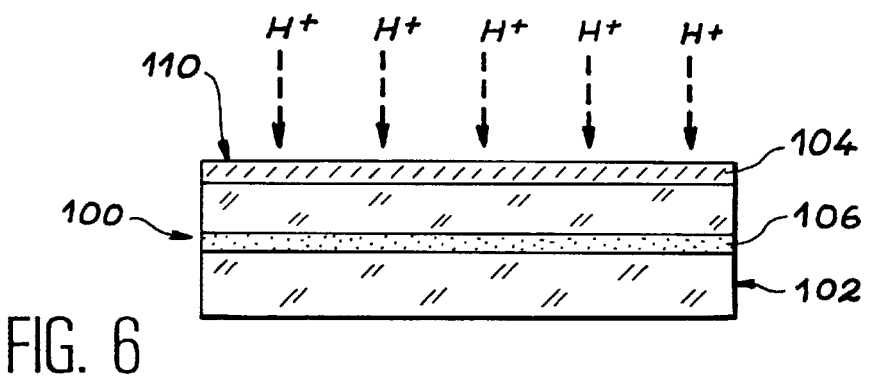
FIG. 6 is a schematic section of a structure comprising a silicon wafer and illustrates the preparation of this structure for molecular bonding according to the invention.

FIG. 6 shows a structure 100 to be bonded by molecular adhesion according to the invention.

The structure 100 comprises a silicon board 102 covered by a surface silicon oxide layer 104.

An implanted hydrogen layer 106 is formed by implantation of hydrogen ions in the silicon board 102 through the oxide layer 104. In this example, the hydrogen layer, implanted at an energy of the order of 70 keV, has a concentration of $3.10^{16}$ ions/cm$^2$, a thickness of 400 nm and is buried at a depth of the order of 300 nm below the upper surface 110 of the structure 100. (The figures are not to scale, and are not in these proportions).

Hydrogen refers to gaseous substances formed either in their atomic form (for example H) or in their molecular form (for example $H_2$) or in their ionic form ($H^+$, $H2^+$, etc.) or in their isotopic form (Deuterium) or isotopic and ionic form.

If necessary, surface 110 of structure 100 is then cleaned in order to make it hydrophile and to remove all particles. A water film (not shown in the figure) is formed on the surface 110.

A small roughness may also be applied to or kept on the surface 110 of structure 100.

Figure 7:
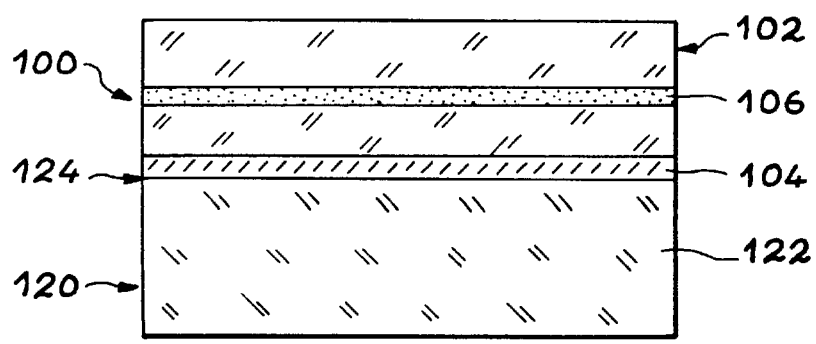
FIG. 7 shows a section of the structure in FIG. 6 bonded to another structure comprising a silicon wafer.

As shown in FIG. 7, the structure 100 is then assembled with a second structure 120. The second structure comprises a silicon board 122, of which the surface in contact with structure 100 has also beneficially be cleaned to make it hydrophile.

Reference 124 denotes the interface between the assembled structures 100 and 120.

The structures are then firstly annealed at a temperature of the order of 500° C. which eliminates water layers between the assembled structures and forms molecular bonds between the surfaces in contact.

The bonding energy of the molecular bonding achieved at 500° C. is of the order of 0.5 J/m$^2$. For example, this bonding energy will be sufficient to bond a silicon board containing integrated circuits to a handling substrate; in particular, it is sufficient for all treatments envisaged for the wafer in equipment normally used for manufacturing microelectronic devices.

When the heat treatment is prolonged, or when another heat treatment is carried out at a temperature of the order of 800° C. or more, unbonding areas (indicated as reference 130 in FIGS. 8 and 9) appear at the interface 124 between the assembled structures 100 and 120.

Figure 8:
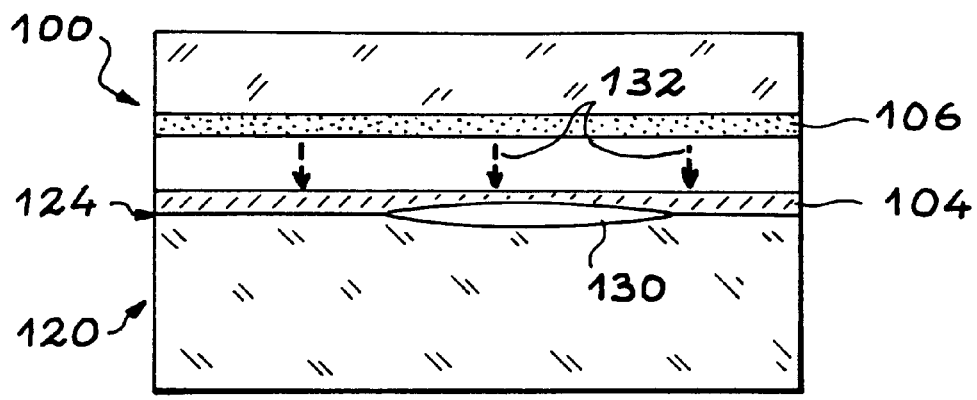
FIGS. 8 and 9 show sections of the assembled structures in FIG. 7, and illustrate a treatment step for unbonding in accordance with the invention.

The formation of unbending areas is controlled by the thermal budget applied to structures. Heat treatment forces hydrogen to diffuse from layer 106 implanted in structure 100 towards the bonding interface 124 (through the oxide if it is present). The hydrogen that diffuses is trapped at the interface 124, accumulates on the interface and may move along it in gaseous form. Thus, the accumulation of hydrogen at interface 124 can at least partly overcome the bonding forces. Arrows 132 in FIGS. 8 and 9 show the diffusion of hydrogen towards the bonding interface 124.

Figure 9:
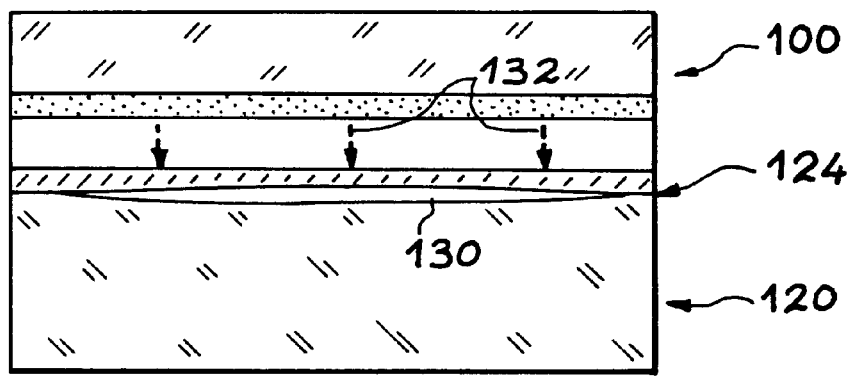

Depending on the magnitude of the thermal budget used, the unbending areas 130 may be local (FIG. 8) or may extend over the entire surface of the interface (FIG. 9).

The thermal budget necessary to obtain complete unbonding depends on the quantity of the element capable of migrating present in the material from at least one of the structures. Consequently, in this example the thermal budget is related to the hydrogen implantation dose. For example, the budget for a dose of $3.1^6$ cm$^3$ may be 900° C. –30 min.

Figure 10:
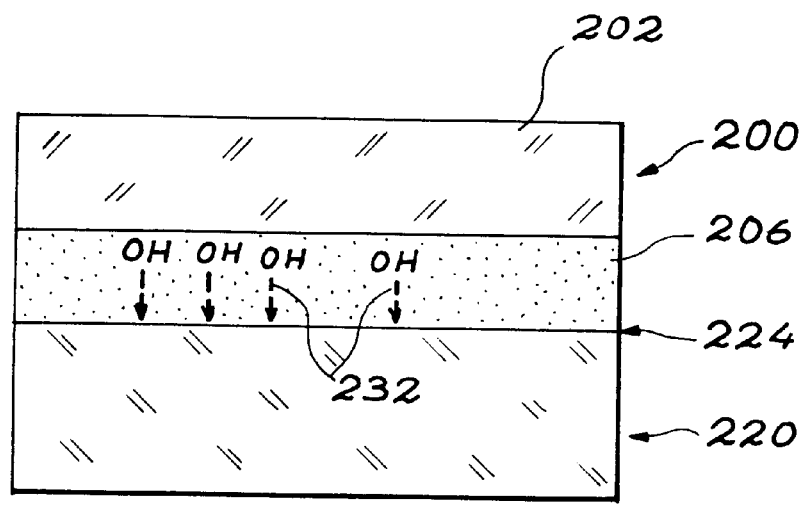
FIG. 10 shows a section of another assembly obtained by molecular bonding of two structures in accordance with the invention.

FIG. 10 indicates another example embodiment of the invention. It shows a sectional view of an assembly of a first structure 200 and a second structure 220 which are bonded by molecular bonding as described above. Reference 224 denotes the bonding interface between the surfaces of assembled structures.

The first structure comprises essentially a silicon wafer 202 at the surface of which an oxide layer 206 has been formed. The oxide in this layer 206 is deposited by a Plasma Enhanced Chemical Vapor Deposition technique. This type of oxide has the specific feature that it contains OH molecules capable of diffusing.

A first heat treatment carried out at a temperature of less than or equal to about 500° C. increases the molecular bonding energy.

When the heat treatment is continued or resumed at temperatures exceeding about 500° C., the OH groups contained in the oxide layer 206 diffuse and migrate, particularly towards the interface 224 where they are trapped. Diffusion of the OH groups towards the interface is indicated with arrows 232.

At interface 224, the OH molecules evolve in gaseous form and concentrate at the bonding interface. This phenomenon causes the formation of bubbles and weakens the bonding interface.

Figure 11:
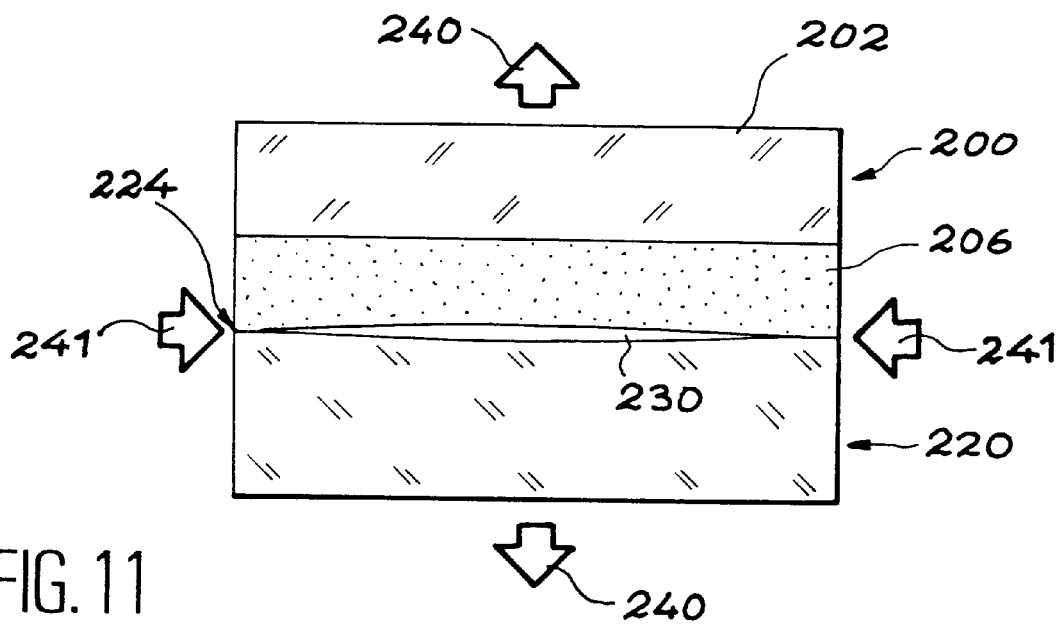
FIG. 11 shows a section of the assembly in FIG. 10 during an unbonding treatment in accordance with the invention.

Under the effect of pressure generated by the gas, an unbonded area 230 shown in FIG. 11 propagates until the two structures 200 and 220 are completely unbonded. Separation of the structures may be facilitated by applying external mechanical separation forces. These forces are shown in FIG. 11 by arrows 240, 241. The forces are tension forces 240 and/or shear forces 241.

It is thus clear that the process according to the invention may be used particularly for molecular bonding of integrated circuit wafers, without any added material, while enabling reversible bonding.

Furthermore, the invention is applicable to any type of structure as defined above. Note that the invention relates not only to structures containing silicon, but also other semiconducting structures (Si, SiC, AsGa, etc. . . ), insulating structures (glass, quartz, etc.) and even conducting structures (metal alloys, etc.).

REFERENCED DOCUMENTS (1)

FR-A-2 744 285

(2)

"Bonding of silicon wafers for silicon-on-insulator"

W. P. Maszara, G. Goetz, A. Caviglia and J. B. McKitterick

Aerospace Technology Center, Allied Signal Aerospace Company, Columbia, Md. 21045

(Received Apr. 12, 1988, accepted for publication Jul. 28, 1988).

(3)

"A model for the silicon wafer bonding process"

R. Stengl, T. Tan and U. Gösele

School of Engineering, Duke University, Durham, N.C. 27706, USA (Received May 8, 1989, accepted for publication Jul. 15, 1989).

Japanese Journal of Applied Physics, vol. 28, No. 10, October 1989, pp. 1735–1741.

What is claimed is:

1. A process for providing separable structures comprising:

providing at least two structures, wherein at least one structure contains a diffusable element;

contacting said structures under conditions providing molecular bonding of said structures along a bonding interface; and heating said bonded structures under conditions causing diffusion of the diffusable element to the bonding interface where said diffusable element interacts with the bonding interface, enabling the unbonding of said structures along the bonding interface.

2. Process according to claim 1, in which hydrogen implantation is done in at least one of the structures before bonding, hydrogen forming said diffusable element.

3. Process according to claim 2, in which said hydrogen implantation is done in a silicon structure with a dose of between $10^{16}$ and $5·10^{16}$ ($H^-/cm^2$) and an energy of between 20 and 500 keV.

4. Process according to claim 1, in which at least one structure comprises a surface oxide layer formed by plasma enhanced chemical vapor deposition and contains OH groups, said OH groups forming the diffusable element.

5. Process according to claim 3, in which heating is done at a temperature of between 600 and 1350° C.

6. Process according to claim 1, in which heating is done by exposing the bonded structures to radiation from heating lamps.

7. Process according to claim 1, in which heating is done in a furnace.

8. Process according to claim 1, in which at least one of the structures is a multi-layer structure.

9. Process according to claim 1, in which the surface of at least one of the structures is prepared before bonding to form a relief on it.

10. Process according to claim 1, in which external separation forces are exerted on the structures to facilitate unbonding.

11. The method of claim 1, wherein the surfaces of said structures are made hydrophilic prior to molecular bonding.

12. The method of claim 1, wherein said structures are unbonded without substantial damage.

13. The method of claim 1, wherein contacting said structures under conditions providing molecular bonding of said structures along the bonding interface comprises a heat treatment.

* * * * *